(12) United States Patent
Kobayashi et al.

(10) Patent No.: US 6,501,182 B2
(45) Date of Patent: Dec. 31, 2002

(54) SEMICONDUCTOR DEVICE AND METHOD FOR MAKING THE SAME

(75) Inventors: Atsushi Kobayashi, Shiga-ken (JP); Masaaki Sueyoshi, Shiga-ken (JP); Masaaki Kanae, Otsu (JP); Makoto Inai, Omihachiman (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/888,951

(22) Filed: Jun. 25, 2001

(65) Prior Publication Data

US 2002/0050650 A1 May 2, 2002

(30) Foreign Application Priority Data

Jul. 5, 2000 (JP) ........................................ 2000-203864

(51) Int. Cl.⁷ ........................... H01L 29/40; H01L 23/34
(52) U.S. Cl. ........................ 257/774; 257/783; 257/707
(58) Field of Search .................. 257/774, 783, 257/707, 719, 729, 785; 438/629, 637, 639, 640, 667, 668, 672, 675, 700, 701, 713, 978

(56) References Cited

U.S. PATENT DOCUMENTS 5,635,762 A * 6/1997 Gamand .................... 257/728
6,319,751 B1 * 11/2001 Lin ............................ 438/108
6,365,974 B1 * 4/2002 Abbott et al. ............... 257/774
6,391,742 B2 * 5/2002 Kawai ........................ 438/456

FOREIGN PATENT DOCUMENTS

| JP | 59-188138 | * 10/1984 | .................. 438/427 |
| JP | 63-166249 | * 7/1988 | ........ 438/FOR 343 |

* cited by examiner

Primary Examiner—Jasmine J B Clark
(74) Attorney, Agent, or Firm—Keating & Bennett, LLP

(57) ABSTRACT

A semiconductor device includes an element formed on a first surface of a semiconductor substrate, a via-hole passing through the semiconductor substrate from the first surface to a second surface of the semiconductor substrate, and an electrode formed on the inner wall of the via-hole, the electrode passing through the semiconductor substrate from the first surface to the second surface. The electrode in the via-hole is electrically connected to at least one electrode of the element; the semiconductor substrate is mounted on a surface mount board; and the electrode formed on the inner wall of the via-hole is electrically connected to an electrode of the surface mount board by a conductive bonding material, such as a conductive adhesive. A method for fabricating the semiconductor device is also disclosed.

3 Claims, 2 Drawing Sheets

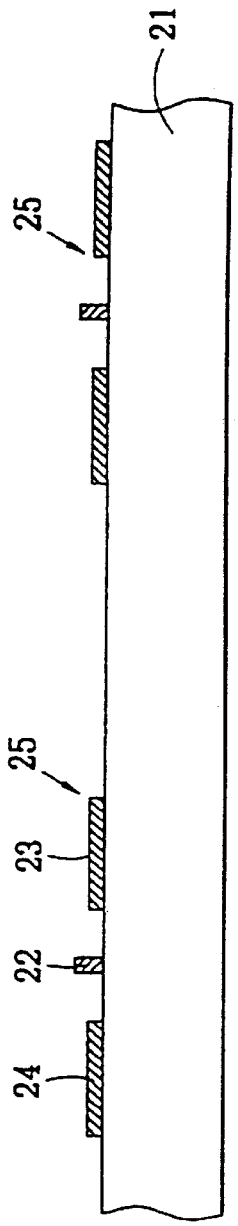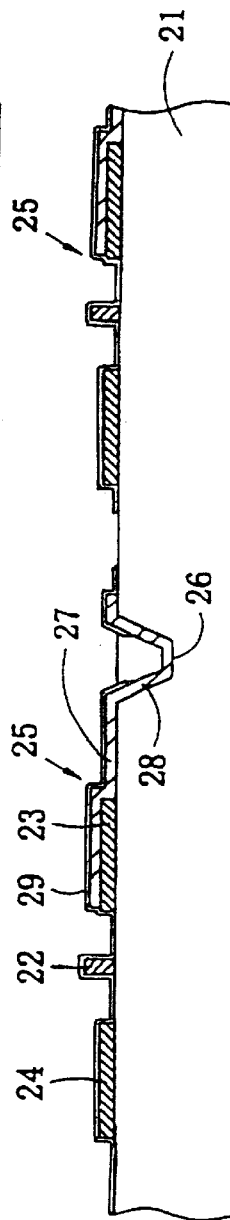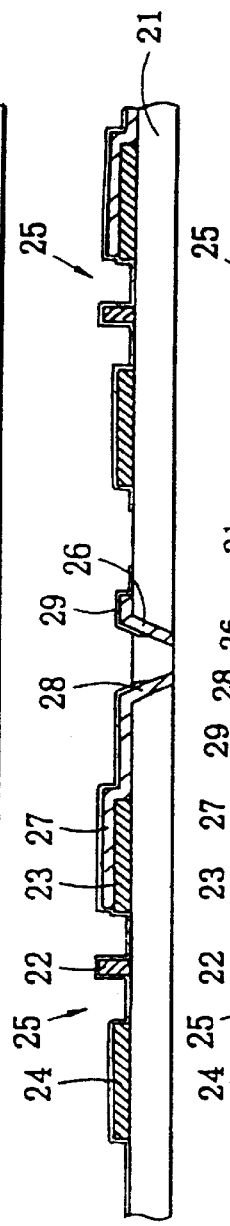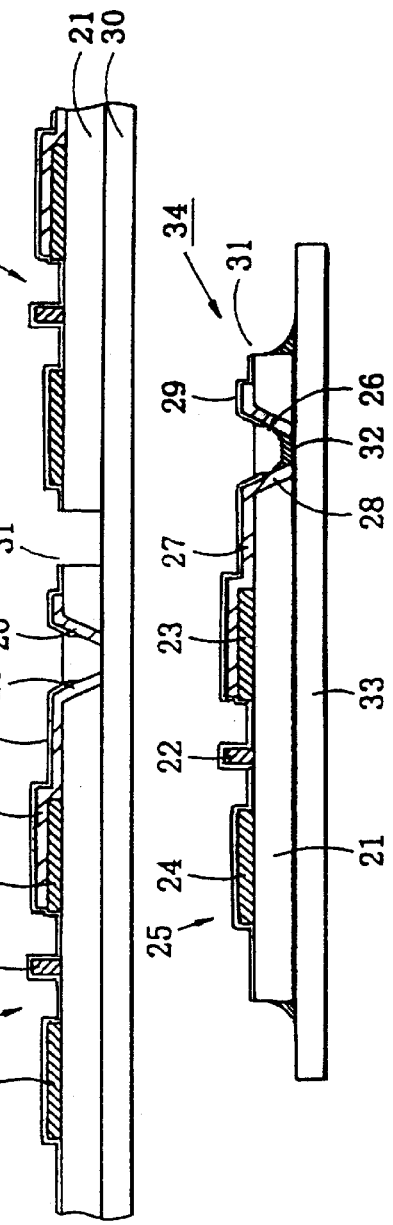
FIG. 3A
FIG. 3B
FIG. 3C
FIG. 3D
FIG. 3E

SEMICONDUCTOR DEVICE AND METHOD FOR MAKING THE SAME

BACKGROUND OF THE INVENTION

1. Field of the Invention

The present invention relates to a semiconductor device and a method for fabricating the same. In particular, the invention relates to the structure of a semiconductor device, such as a high-frequency semiconductor device provided with back panel ground and a high-power semiconductor device provided with a heat-dissipating function.

2. Description of the Related Art

FIG. 1 is a sectional view of a conventional semiconductor device provided with a heat-dissipating function on the back surface. The semiconductor device includes a field-effect transistor (FET) 5, which includes a gate electrode 2, a source electrode 3, and a drain electrode 4, disposed on a semiconductor substrate (wafer) 1. The surface of the FET 5 is covered by an insulating film 6. A heat sink electrode (plated heat sink; PHS) 7 composed of Au or the like is formed on the entire back surface of the semiconductor substrate 1. A via-hole 8, which is tapered from the lower surface to the upper surface, is made in the semiconductor substrate 1, and the lower surface of the source electrode 3 is exposed to the via-hole 8. The lower surface of the source electrode 3 which is exposed to the via-hole 8 and the heat sink electrode 7 are electrically and thermally connected to each other by a via-hole electrode 9 composed of Au or the like formed in the via-hole 8.

When the semiconductor device is mounted on a surface mount board or the like, the heat sink electrode 7 on the back surface is connected to a ground line of the surface mount board.

A method for fabricating the semiconductor device will be briefly described. After the FET 5 is formed on the semiconductor substrate 1, etching is performed on the back surface of the semiconductor substrate 1 to form the via-hole 8 beneath. By depositing an electrode-forming metal, such as Au, on the inner wall of the via-hole 8 and on the entire back surface of the substrate 1, the via-hole electrode 9 and the heat sink electrode 7 are formed.

FIG. 2 is a sectional view of another conventional semiconductor device provided with a heat-dissipating function on the back surface. In order to fabricate this semiconductor device, a FET 5, which includes a gate electrode 2, a source electrode 3, and a drain electrode 4, is formed on a first surface (front surface) of a semiconductor substrate 1, and then etching is performed from the front surface of the semiconductor substrate 1 toward the second surface (back surface) to make a via-hole 11 which does not completely pass through the semiconductor substrate 1. Next, a wiring electrode 12 and a via-hole electrode 13 are continuously formed on the source electrode 3 and the inner wall of the via-hole 11, respectively. The semiconductor substrate 1 is then ground and etched from the back surface so that the via-hole 11 reaches the back surface of the semiconductor substrate 1 and the via-hole electrode 13 is exposed on the back surface of the semiconductor substrate 1. A heat sink electrode 7 is then formed on the entire back surface of the semiconductor substrate 1, and thus the heat sink electrode 7 and the via-hole electrode 13 are electrically and thermally connected to each other.

In a semiconductor device having either one of the structures described above, since the heat generated from the FET 5 is absorbed by the heat sink electrode 7 provided on the back surface through the via-hole electrode 9 or 13, and then is dissipated into the air or to the base of the package, etc., it is possible to reduce an increase in the temperature of the FET 5. The heat sink electrode 7 on the back surface is also used as a grounding electrode.

However, in the semiconductor device having such a structure, since the semiconductor substrate 1 and the heat sink electrode 7 are bonded to each other, when the temperature changes in the semiconductor device, the FET 5 is subjected to a mechanical stress due to a difference in the coefficient of thermal expansion between the semiconductor substrate 1 and the heat sink electrode 7, which may result in damage to the FET 5 and degradation in device performance. Additionally, since the heat sink electrode 7 must be formed on the entire back surface of the semiconductor substrate 1, the number of steps in the fabrication process of semiconductor devices increases, resulting in an increase in fabrication cost.

In the conventional semiconductor device shown in FIG. 1, since the via-hole 8 is made from the back surface of the semiconductor substrate 1, when the individually divided semiconductor devices (FET 5 chips) are mounted on the base of the package, etc., by die bonding, air bubbles are likely to remain between the via-hole 8 and the package, etc. If air bubbles are enclosed in the via-hole 8, the air bubbles may expand due to the heating in the fabrication process or heat generated by the semiconductor device, resulting in damage to the semiconductor device.

In the conventional semiconductor device shown in FIG. 2, since the via-hole electrode 13 must be exposed by grinding and etching the semiconductor substrate 1 from the back surface, the operation of decreasing the thickness of the semiconductor substrate 1 (grinding) must be stopped with exact timing when the via-hole electrode 13 is exposed on the back surface of the semiconductor substrate 1. In such a process, a technique for monitoring and controlling the grinding step with high accuracy is required.

SUMMARY OF THE INVENTION

Accordingly, it is an object of the present invention to provide a semiconductor device in which damage to the device and degradation in performance do not easily occur due to heating or a change in temperature, the control in the fabrication process is facilitated, and the fabrication cost is low, and to provide a method for fabricating the semiconductor device.

In one aspect of the present invention, a semiconductor device includes an element formed on a first surface of a semiconductor substrate, a via-hole passing through the semiconductor substrate from the first surface to a second surface of the semiconductor substrate, and a via-hole electrode formed on the inner wall of the via-hole, the via-hole electrode passing through the semiconductor substrate from the first surface to the second surface. The via-hole electrode is electrically connected to an electrode of the element, the semiconductor substrate is mounted on a surface mount board, and the via-hole electrode is electrically connected to an electrode of the surface mount board by a conductive bonding material, such as a conductive adhesive, e.g., silver paste.

In another aspect of the present invention, a method for fabricating a semiconductor device includes the steps of (a) forming a via-hole in a semiconductor substrate provided with an element so that the via-hole passes through the semiconductor substrate from a first surface to a second surface, and forming a via-hole electrode on the inner wall of the via-hole so as to be electrically connected to an electrode of the element and to pass through the semiconductor substrate from the first surface to the second surface; and (b) fixing the semiconductor substrate on a surface mount board by a conductive adhesive and electrically connecting the via-hole electrode and an electrode of the surface mount board by the conductive bonding material entering from the bottom opening of the via-hole electrode.

Preferably, the step (a) includes sub-steps of forming a concave section on the first surface of the semiconductor substrate, forming the via-hole electrode in the concave section; and milling the second surface of the semiconductor substrate so that the via-hole and the via-hole electrode are exposed on the second surface of the semiconductor substrate.

In accordance with the present invention, in the semiconductor device and the method for fabricating the same, since the via-hole provided in the semiconductor substrate and the electrode on the inner wall of the via-hole pass through the substrate from the first surface to the second surface, when the semiconductor substrate provided with the element is mounted on a surface mount board, such as a package, air is prevented from being entrapped in the via-hole, and thus there is no possibility that the semiconductor substrate is damaged by an expansion of air in the via-hole due to heating and a change in temperature, as is the case in the conventional semiconductor device.

Since the via-hole and the electrode on the inner wall thereof penetrate the semiconductor substrate, when the semiconductor substrate is mounted on a surface mount board, it is possible to check the position of the electrode of the surface mount board through the via-hole, thus facilitating the assembly of the semiconductor device. Furthermore, the semiconductor substrate is tightly fixed by the conductive adhesive which enters the via-hole from the surface of the surface mount board.

When the electrode on the inner wall of the via-hole is exposed on the second surface of the semiconductor substrate by decreasing the thickness from the second surface of the semiconductor substrate by grinding, etc., a technique for decreasing the thickness of the substrate with high accuracy is not required, unlike the conventional semiconductor device in which the electrode remains at the opened portion of the via-hole, thus facilitating the fabrication process.

As compared with the conventional semiconductor device, since an electrode for back panel ground, such as a PHS, is not provided on the back surface, there is no possibility that warping will occur in the semiconductor substrate due to a difference in the coefficient of thermal expansion between the semiconductor substrate and the electrode for back panel ground. Since the electrode for back panel ground is not required, the fabrication cost is reduced.

Other features and advantages of the present invention will become apparent from the following description of the invention which refers to the accompanying drawings.

BRIEF DESCRIPTION OF THE DRAWING(S)

FIGS. 3A to 3E are sectional views showing the fabrication steps of a semiconductor device in an embodiment of the present invention.

DETAILED DESCRIPTION OF THE PREFERRED EMBODIMENTS

Figure 1:
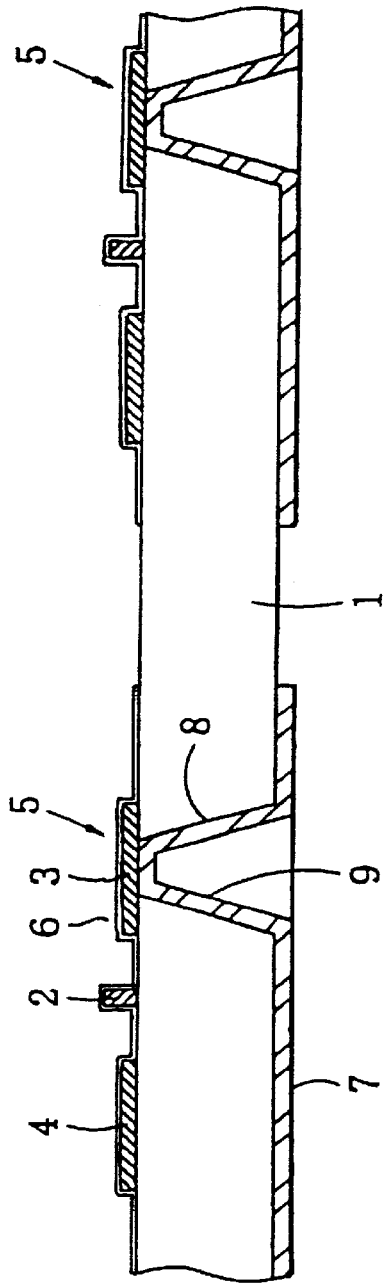
FIG. 1 is a sectional view showing the structure of a conventional semiconductor device.

FIGS. 3A to 3E show the fabrication steps of a semiconductor device, such as a field effect transistor (FET) or a monolithic microwave integrated circuit (MMIC), in an embodiment of the present invention.

First, as shown in FIG. 3A, an active layer and the like are formed on the surface of a semiconductor substrate (wafer) 21 by ion implantation, and/or other conventional methods, and a gate electrode 22, a source electrode 23, and a drain electrode 24 are formed thereon to constitute a FET 25. The substrate may be composed of Si or a compound semiconductor, such as GaAs.

Next, as shown in FIG. 3B, a via-hole 26 with a depth of 200 $\mu$m to 200 $\mu$m is made on the surface of the semiconductor substrate 21. At this stage, the via-hole 26 does not penetrate the semiconductor substrate 21, and the via-hole 26 is blocked by the back side of the semiconductor substrate 21. In order to make the via-hole 26, either wet etching or dry etching may be used.

A wiring electrode 27 and a via-hole electrode 28 are continuously formed on the source electrode 23 and on the entire inner wall of the via-hole 26. In order to form the wiring electrode 27 and the via-hole electrode 28, a photoresist is applied on the FET 25 and on the semiconductor substrate 21. After the photoresist is patterned by photolithography, a metallic material is vapor-deposited thereon, and the unnecessary portion of the metallic material is removed. Additionally, the wiring electrode 27 and the via-hole electrode 28 may be formed by other methods, such as sputtering or selective plating. After the wiring electrode 27 and the via-hole electrode 28 are formed, the FET 25 is covered with an insulating film 29 composed of silicon nitride or the like.

Figure 2:
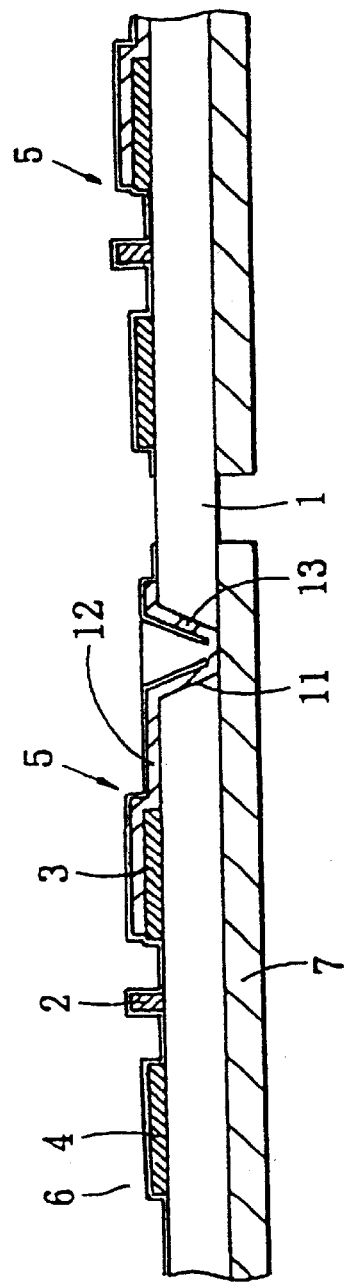
FIG. 2 is a sectional view showing the structure of another conventional semiconductor device.

Next, as shown in FIG. 3C, the semiconductor substrate 21 is ground from the back surface and the via-hole 26 and the via-hole electrode 28 are exposed on the back surface of the semiconductor substrate 21. At this stage, as long as the via-hole 26 is penetrated and the via-hole electrode 28 is exposed on the bottom opening of the via-hole 26, even if there are slight inconsistencies in the grinding, electrical contact can be made in the subsequent step. Thus, in contrast to the conventional method described with reference to FIG. 2, inconsistencies in grinding do not adversely affect the product. As a method for decreasing the thickness of the semiconductor substrate 21, any method other than grinding may be used as long as the via-hole electrode 28 is exposed.

Next, as shown in FIG. 3D, by attaching an adhesive tape 30 to the back surface of the semiconductor substrate 21, the semiconductor substrate (wafer) 21 is supported and while maintained in that state, the semiconductor substrate 21 is divided into the individual FET chips 31 by dicing. Alternatively, when the via-hole 26 is formed, a projected dividing area may be also etched so that separation of the FET 25 is completed simultaneously with the decreasing of the thickness of the semiconductor substrate 21.

After the individual FET chips 31 are separated and removed from the adhesive tape 30, the FET chip 31 is bonded to a base (surface mount board) 33 to which a conductive die-bonding material 32, such as a conductive adhesive, e.g., silver paste, has previously been applied. At this stage, the conductive die-bonding material 32 enters the lower part of the penetrated via-hole 26 and is connected to the via-hole electrode 28, and thus an electrode of the base 33 and the source electrode 23 of the FET 25 formed on the surface of the semiconductor substrate 21 are electrically connected to each other with the via-hole electrode 28 and the wiring electrode 27 therebetween. Thereby, a semiconductor device 34 is fabricated. The base 33 may be composed of a metal plate, or may be composed of an insulating plate provided with a heat sink electrode on the entire surface thereof. In either case, heat generated by the FET 25 is absorbed by the base 33 and is dissipated into the air, etc. The base 33 may also function as a grounding electrode.

In the semiconductor device thus fabricated, since the via-hole electrode 28 is directly connected to the base 33 of the package by the conductive die-bonding material 32 entering the via-hole 26, it is not necessary to provide the back panel ground structure comprising a PHS on the back surface of the semiconductor substrate, and therefore, the FET chip 31 is not subjected to stress by a change in temperature, etc., and degradation in element characteristics and damage to the chip can be prevented from occurring.

Since the via-hole 26 and the via-hole electrode 28 pass through the semiconductor substrate 21 from the front surface to the back surface, when the semiconductor substrate 21 is bonded to the base 33, air bubbles are not entrapped in the via-hole 26, and the FET chip 31 is not damaged by expansion of air bubbles due to heating and an increase in temperature as is the case in the conventional semiconductor device.

When the thickness of the semiconductor substrate 21 is decreased by grinding, etc., it is not necessary to leave the bottom face of the via-hole electrode 28 untouched as is the case in the conventional semiconductor device, and since the via-hole electrode 28 is opened, a technique for decreasing the thickness of the semiconductor substrate 21 with high accuracy and a high level control are not required.

Furthermore, since the back panel ground structure is obtained by bonding the via-hole electrode 28 to the ground line of the base 33, it is not necessary to form a metal layer, such as a PHS, and an advanced technique for decreasing the thickness of the substrate is not required, and thus the fabrication cost can be reduced.

Since the via-hole 26 and the via-hole electrode 28 pass through the semiconductor substrate 21, when the via-hole electrode 28 is connected to the electrode of the base 33, alignment can be performed easily while checking the position of the electrode of the base 33 from the upper side of the semiconductor substrate 21.

When the FET chip 31 is mounted, since the conductive die-bonding material 32 enters the via-hole 26 from the bottom and is solidified as if a rivet is inserted into the via-hole 26, the die-bonding material 32 displays the anchor effect and the FET chip 31 is tightly fixed to the package. In particular, when the via-hole 26 has a tapered shape in which the width increases toward the upper surface of the substrate, the anchor effect is intensified.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A semiconductor device comprising:

an element formed on a first surface of a semiconductor substrate, the semiconductor substrate having a via-hole passing through the semiconductor substrate from the first surface to a second surface of the semiconductor substrate; and a via-hole electrode formed on the inner wall of the via-hole, the via-hole electrode passing through the semiconductor substrate from the first surface to the second surface, wherein the via-hole electrode is electrically connected to an electrode of the element, the semiconductor substrate is mounted on a surface mount board, and the via-hole electrode is electrically connected to an electrode of the surface mount board by a conductive bonding material.

2. A semiconductor device according to claim 1, wherein the conductive bonding material is a conductive adhesive.

3. A semiconductor device according to claim 2, wherein the conductive adhesive comprises a silver paste.

* * * * *